(12) United States Patent
Inoue et al.

(10) Patent No.: US 8,953,337 B2
(45) Date of Patent: Feb. 10, 2015

(54) COMMUNICATION APPARATUS WITH REMOVABLE CIRCUIT BOARDS

(75) Inventors: Masaaki Inoue, Hadano (JP); Takashi Matsumoto, Hadano (JP); Kazuhiro Matsuo, Hadano (JP); Junji Baba, Hadano (JP); Manabu Sawa, Hadano (JP); Kazuo Sugai, Hadano (JP)

(73) Assignee: Alaxala Networks Corporation, Kawasaki (JP)

( * ) Notice: Subject to any disclaimer, the term of this patent is extended or adjusted under 35 U.S.C. 154(b) by 267 days.

(21) Appl. No.: 13/005,332

(22) Filed: Jan. 12, 2011

(65) Prior Publication Data

US 2011/0170270 A1 Jul. 14, 2011

(30) Foreign Application Priority Data

Jan. 13, 2010 (JP) ................................. 2010-004901

(51) Int. Cl.
*A47G 19/08* (2006.01)
*H05K 7/14* (2006.01)

(52) U.S. Cl.
CPC .................................. *H05K 7/1445* (2013.01)
USPC ........................................ 361/788; 211/41.17

(58) Field of Classification Search
USPC ....................................................... 211/41.17
See application file for complete search history.

(56) References Cited

U.S. PATENT DOCUMENTS

| | | | | |
|---|---|---|---|---|
| 3,963,301 A | * | 6/1976 | Stark | 439/680 |
| 4,002,953 A | * | 1/1977 | Tetlie | 361/756 |
| 5,245,613 A | * | 9/1993 | Takami et al. | 370/509 |
| 5,978,233 A | * | 11/1999 | Roscoe et al. | 361/796 |
| 6,220,874 B1 | * | 4/2001 | Kurata et al. | 439/76.2 |
| 6,243,273 B1 | * | 6/2001 | Beun et al. | 361/796 |
| 6,487,091 B2 | * | 11/2002 | Malkowski et al. | 361/826 |
| 7,075,796 B1 | * | 7/2006 | Pritchett | 361/796 |
| 7,154,761 B1 | * | 12/2006 | Camerlo et al. | 361/788 |
| 7,281,063 B2 | * | 10/2007 | Benson et al. | 710/2 |
| 7,349,208 B2 | * | 3/2008 | Marumoto | 361/690 |
| 7,349,227 B2 | * | 3/2008 | Kashiwazaki | 361/796 |
| 7,360,660 B2 | * | 4/2008 | Tsuzuki | 211/41.17 |
| 7,371,967 B2 | * | 5/2008 | MaHoney et al. | 174/117 F |
| 7,425,685 B1 | * | 9/2008 | Gundogan et al. | 174/520 |
| 7,525,816 B2 | * | 4/2009 | Sawachi | 361/792 |
| 7,813,146 B1 | * | 10/2010 | Phan | 361/826 |
| 7,969,751 B2 | * | 6/2011 | Yamamoto et al. | 361/826 |

(Continued)

FOREIGN PATENT DOCUMENTS

| | | |
|---|---|---|
| JP | 59-141294 A | 8/1984 |
| JP | 2002-026549 A | 1/2002 |

(Continued)

OTHER PUBLICATIONS

Office Action received in releated Japanese Application No. 2010-004901 dated Feb. 12, 2013 (English Translation).

*Primary Examiner* — Hoa C Nguyen
*Assistant Examiner* — Xanthia C Cunningham
(74) *Attorney, Agent, or Firm* — Foley & Lardner LLP

(57) ABSTRACT

The present invention relates to an electronic device including plural circuit board units that can be removed from the electronic device. The electronic device is designed to increase a data transfer rate between the circuit board units by using a circuit board for interconnect for electrically coupling the circuit board units placed in the electronic device, and using a cable for electrically or optically coupling the circuit board units placed in the electric device, or both of the cables.

12 Claims, 6 Drawing Sheets

(56) References Cited

U.S. PATENT DOCUMENTS

| | | | |
|---|---|---|---|
| 8,045,335 B2* | 10/2011 | Takano et al. | 361/784 |
| 2005/0041389 A1* | 2/2005 | Martin et al. | 361/685 |
| 2006/0238991 A1* | 10/2006 | Drako | 361/796 |
| 2007/0081308 A1* | 4/2007 | Ishida | 361/724 |
| 2007/0081315 A1* | 4/2007 | Mondor et al. | 361/788 |
| 2007/0133186 A1* | 6/2007 | Sheffield | 361/788 |
| 2007/0230152 A1 | 10/2007 | Abe | |
| 2008/0101049 A1* | 5/2008 | Casto et al. | 361/788 |
| 2008/0212276 A1* | 9/2008 | Bottom et al. | 361/686 |
| 2008/0285248 A1* | 11/2008 | Goergen | 361/788 |
| 2009/0027867 A1 | 1/2009 | Yamamoto et al. | |
| 2009/0066282 A1* | 3/2009 | Worrall | 318/441 |
| 2009/0067146 A1* | 3/2009 | Huels et al. | 361/788 |
| 2009/0154088 A1* | 6/2009 | Huang et al. | 361/679.33 |

FOREIGN PATENT DOCUMENTS

| | | |
|---|---|---|
| JP | 2007-266528 | 10/2007 |
| JP | 2009-027079 A | 2/2009 |

* cited by examiner

COMMUNICATION APPARATUS WITH REMOVABLE CIRCUIT BOARDS

CLAIM OF PRIORITY

The present application claims priority from Japanese patent application serial no. 2010-004901, filed on Jan. 13, 2010, the content of which is hereby incorporated by reference into this application.

BACKGROUND OF THE INVENTION

The present invention relates to an electronic device, and more particularly to an electronic device including plural circuit board units that can be removed from the electric device.

Switches and routers are widely used as network communication devices for data transfer in a network. In general, the network communication device, such as a switch or router, includes a circuit board unit having an interface function for data transfer in a network, as well as a circuit board unit having a control function for controlling the data transfer. These circuit board units are removable. Signals (for example, data signals and control signals) are transmitted and received between the circuit board units placed in the network communication device, through a circuit board for interconnect (or so-called backboard) (see, for example, JP-A No. 266528/2007).

SUMMARY OF THE INVENTION

In recent years, there has been a growing demand for a further increase in the data transfer rate between the circuit board units in the network communication device. In order to further increase the data transfer rate between the circuit board units, for example, there has been proposed to increase the data transfer rate of the circuit board for interconnect by using a dielectric material with a small dielectric loss or by increasing the number of layers. However, this approach would restrict the use of parts, increase the production costs, and make the wiring complex, or would cause other problems. Thus, the application of this approach is not easy.

The above identified problems are not only those of the network communication device such as a switch and router, but also those of an electronic device including plural circuit board units that can be removed from the electronic device.

The present invention is to solve the above problems of the prior art, and to provide a technique that allows an electronic device including plural circuit board units to increase the data transfer rate between the circuit board units.

In order to address at least some of the problems described above, the present invention can be realized as the following aspects or application examples.

A first aspect is an electronic device including plural circuit board units that can be removed from the electronic device, a circuit board for interconnect for electrically coupling the circuit board units placed in the electronic device, and a cable for coupling the circuit board units placed in the electronic device.

The electronic device includes plural circuit board units, as well as the circuit board for interconnect for electrically coupling the circuit board units placed in the electronic device, and the cable for electrically or optically coupling the circuit board units placed in the electronic device. In this configuration, it is possible to increase the data transfer rate between the circuit board units.

A second aspect is the electronic device described in the first aspect. The circuit board unit is coupled to the circuit board for interconnect through a first connector pair. The first connector pair includes a first board unit side connector provided in the circuit board unit, and an interconnect board side connector provided in the circuit board for interconnect and being able to fit into the first board unit side connector. The circuit board unit is coupled to the cable through a second connector pair. The second connector pair includes a second board unit side connector provided in the circuit board unit, and a cable side connector coupled to the cable and being able to fit into the second board unit side connector.

In this electronic device including the plural circuit board units that can be removed from the electronic device, it is possible to increase the data transfer rate between the circuit board units placed in the electronic device.

A third aspect is the electronic device described in the second aspect. The first board unit side connector and the second board unit side connector are provided on an edge of the circuit board unit on a side of the circuit board for interconnect.

In this electronic device, it is possible to prevent the component area of the other components from being restricted and the packaging density from being reduced, by the first and second board unit side connectors. It is also possible to prevent the maintainability from being reduced, while reducing the volume of the cable used in the electronic device to the minimum.

A fourth aspect is the electronic device described in the second or third aspect. The electronic device further includes an adopter for forming a sub module with the cable and the cable side connector.

In this electronic device, it is possible to improve the efficiency of wiring the cable, improve the efficiency of installing the sub module to the electronic device, prevent the occurrence of defects such as cable disconnections, and increase the packaging density. In addition, the efficiency of cable replacement can also be improved.

A fifth aspect is the electronic device described in the fourth aspect, in which the adopter is fixed to the circuit board for interconnect.

In this electronic device, it is possible to improve the efficiency of installing the sub module to the electronic device.

A sixth aspect is the electronic device described in the fifth aspect, in which at least one of the cable side connector and the second board unit side connector has a floating structure that allows the particular connector to move in a predetermined direction by a predetermined distance.

In this electronic device, it is possible to easily realize satisfactory fitting both in the first and second connector pairs, regardless of the accuracy of the positional relationship between the cable side connector and the interconnect board side connector.

A seventh aspect is the electronic device described in any one of the second to sixth aspects. A position of the second board unit side connector in the circuit board unit is more distant from the circuit board for interconnect than a position of the first board unit side connector.

In this electronic device, it is possible to ensure the cable wiring space while preventing the packaging density from being reduced.

An eight aspect is the electronic device described in the seventh aspect, in which a notch is formed on the edge of the circuit board unit on the side of the circuit board for interconnect. The second board unit side connector is provided in a portion of the notch formed in the circuit board unit.

In this electronic device, it is possible to easily locate the second board unit side connector in a position more distant from the circuit board for interconnect than the position of the first board unit side connector.

A ninth aspect is the electronic device described in the seventh aspect, in which the circuit board unit includes a main circuit board and a sub circuit board mounted on the main circuit board. At this time, an edge of the sub circuit board on the circuit board for interconnect is more distant from the circuit board for interconnect than the main circuit board. The first board unit side connector is provided on an edge of the main circuit board on the side of the circuit board for interconnect. The second circuit unit side connector is provided on the edge of the sub circuit board on the side of the circuit board for interconnect.

In this electronic device, it is possible to easily locate the second board unit side connector in a position more distant from the circuit board for interconnect than the first board unit side connector. Further, it is also possible to increase the packaging density.

A tenth aspect is the electronic device described in any one of the first to ninth aspects, in which the electronic device is a network communication device for data transfer in a network. At least one of the circuit board units has an interface function for the data transfer, and at least one of the circuit board units has a control function for controlling the data transfer.

This electronic device is used as the network communication device that can increase the data transfer rate between the circuit board units.

An eleventh aspect is the electronic device described in the tenth aspect. Transmission of the data between the circuit board units is performed through the cable. Transmission of signals for the control between the circuit board units is performed through the circuit board for interconnect.

This electronic device is used as the network communication device, in which the data transmission between the circuit board units is performed through the cable, and the signal transmission for the control between the circuit board units is performed through the circuit board for interconnect. In this way, it is possible to increase the data transfer rate between the circuit board units.

A twelfth aspect is an electronic device including plural circuit board units that can be removed from the electronic device, and a cable for coupling the circuit board units placed in the electronic device. The circuit board units are coupled only through the cable.

In this electronic device, the circuit board units are coupled only through the cable in order to achieve a high-speed data transfer.

It is to be understood, however, that the present invention may be embodied in various forms. For example, the present invention may be embodied by an electronic device, a network communication device, a signal transmission method in the electronic device or network communication device, a computer program for realizing the function of the method or devices, a recording medium in which the computer program is recorded, and a data signal including the computer program and realized in a carrier wave, or other forms.

According to the present invention, it is possible to provide an electronic device including plural circuit board units, in which the data transfer rate between the circuit board units can be increased.

BRIEF DESCRIPTION OF THE DRAWINGS

Preferred embodiments of the present invention will now be described in conjunction with the accompanying drawings, in which.

DETAILED DESCRIPTION OF THE PREFERRED EMBODIMENTS

Embodiments in the form of first and second embodiments and modifications will now be described in more detail with reference to the accompanying drawings.

A. First Embodiment

Figure 1A:
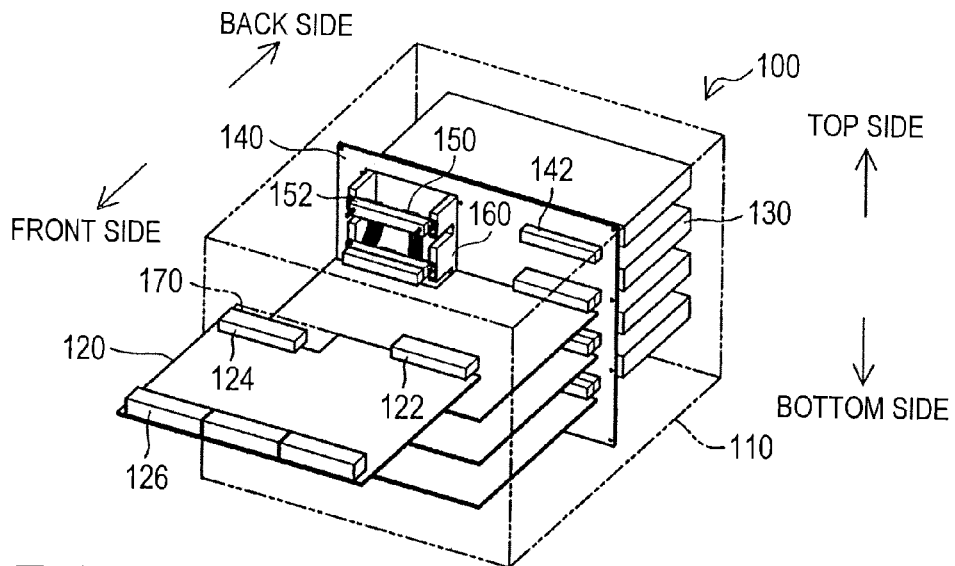
FIG. 1A is a front side perspective view of a switch.
Figure 1B:
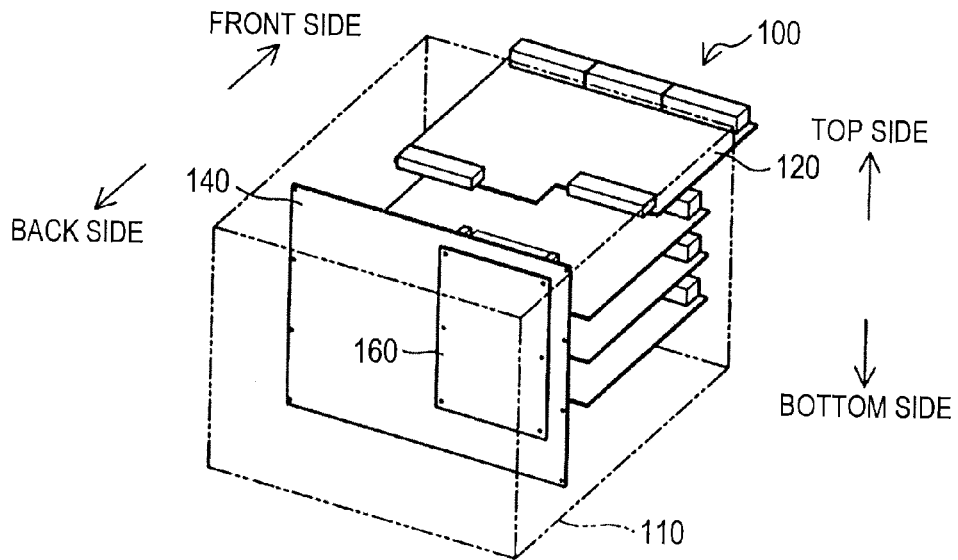
FIG. 1B is a back side perspective view of the switch.
Figure 1C:
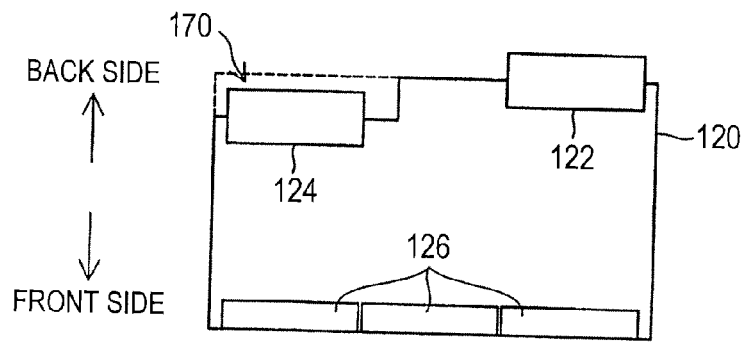
FIG. 1C is a top view of a circuit board unit.

FIGS. 1A to 1C are schematic views showing the configuration of a switch 100, as an electronic device, according to a first embodiment. In FIGS. 1A to 1C, the switch 100 functions as a network communication device for transferring data (also more specifically called a frame or packet) in a computer network.

FIG. 1A is a front side perspective view of the switch 100. FIG. 1B is a back side perspective view of the switch 100. FIG. 1C is a top view of a circuit board unit 120. As shown in FIGS. 1A and 1B, the switch 100 includes plural circuit board units 120, plural power units 130, and a circuit board for interconnect 140, all of which are placed in a chassis 110. It is to be noted that FIGS. 1A and 1B also show the components of the switch 100, which are actually provided within the chassis 110 and invisible from the outside. FIG. 1B omits showing the power units 130. It is also possible that the switch 100 includes a cooling unit.

The circuit board unit 120 includes a circuit board on which a semiconductor device is mounted. The circuit board unit 120 realizes various functions for data transfer performed by the switch 100. The switch 100 includes four circuit board units 120. Of the four circuit board units 120, the top and bottom circuit board units 120 (hereinafter also referred to as the interface units) have an interface function for the data transfer in the network. The remaining two circuit board units 120 (hereinafter also referred to as the control units) have a control function for controlling the data transfer.

It is to be noted that the number of the circuit board units 120 included in the switch 100 is not limited to four units. More specifically, the switch 100 may include one interface unit or three or more interface units, and one control unit or three or more control units. It is also possible that the switch 100 includes the circuit board unit 120 having another function for the data transfer performed by the switch 100.

The circuit board unit 120 is designed to be inserted and removed along a slot, not shown, formed in the chassis 110 of the switch 100. In other words, the circuit board unit 120 is inserted into the switch 100 from an opening of the slot provided on the front side of the switch 100, to the back side of the switch 100. In this way, the circuit board unit 120 is placed in the switch 100. The inserted circuit board unit 120 is pulled out to the front side of the switch 100. In this way, the circuit board unit 120 can be removed from switch 100. This makes it possible to increase the functionality and redundancy of the switch 100. FIGS. 1A and 1B show the state in which the top circuit board unit 120 is removed from the switch 100, and the remaining three circuit board units 120 are placed in the switch 100.

As shown in FIG. 1A to FIG. 1C, the circuit board unit 120 includes a board unit side connector 122 for coupling to the circuit board for interconnect 140, a board unit side connector 124 for coupling to a cable 150 described below, and an external interface connector 126 for coupling to an external interface. The external interface connector 126 is provided on the edge of the front side of the circuit board unit 120 (on the opposite side to the circuit board for interconnect 140). The board unit side connectors 122 and 124 are provided on the edge of the back side of the circuit board unit 120 (on the side of the circuit board for interconnect 140). A notch 170 is formed on the edge of the back side of the circuit board unit 120. In other words, a part of the edge of the back side of the circuit board unit 120 is set back. The board unit side connector 124 is provided in a portion of the notch 170 formed in the circuit board unit 120. Thus, the position of the board unit side connector 124 in the circuit board unit 120 is more forward, or more distant from the circuit board for interconnect 140 than the position of the board unit side connector 122 (see FIG. 1B). It is to be noted that the board unit side connector 122 is also referred to as the first board unit side connector, and the board unit side connector 124 as the second board unit side connector.

Each of the power units 130 is provided on the back side of the circuit board for interconnect 140 in the chassis 110. The power unit 130 supplies power to the circuit board unit 120. It is to be noted that the switch 100 does not necessarily include plural power units 130 but may include only one power unit 130.

The circuit board for interconnect 140 is a circuit board (or so-called backboard) for electrically coupling the circuit board units 120, and relaying signals transmitted and received between the circuit board units 120. The circuit board for interconnect 140 is fixed to the inside of the chassis 110 of the switch 100, in a direction substantially perpendicular to the axis extending from the front surface to the back surface of the switch 100. The circuit board for interconnect 140 includes four interconnect board side connectors 142 corresponding to the four circuit board units 120. The interconnect board side connectors 142 are provided on the front side surface of the circuit board for interconnect 140. The interconnect board side connector 142 is located so as to fit into the board unit side connector 122 of the circuit board unit 120 when the circuit board unit 120 is placed in the switch 100. One board unit side connector 122 and one interconnect board side connector 142 are configured such that one is a socket and the other is a header. The two connectors fit together to form a connector pair (also referred to as a first connector pair), and are electrically coupled to each other. The circuit board for interconnect 140 has a wiring not shown for coupling the interconnect board side connectors 142. When the interconnect board side connector 142 and the board unit side connector 122 fit together, the circuit board units 120 are electrically coupled to each other through the board unit side connector 122, the interconnect board side connector 142, and the circuit board for interconnect 140. In this state, signals can be transmitted and received between the circuit board units 120. As shown in FIGS. 1A and 1B, the adopter 160 is fixed to the circuit board for interconnect 140.

Figure 2A:
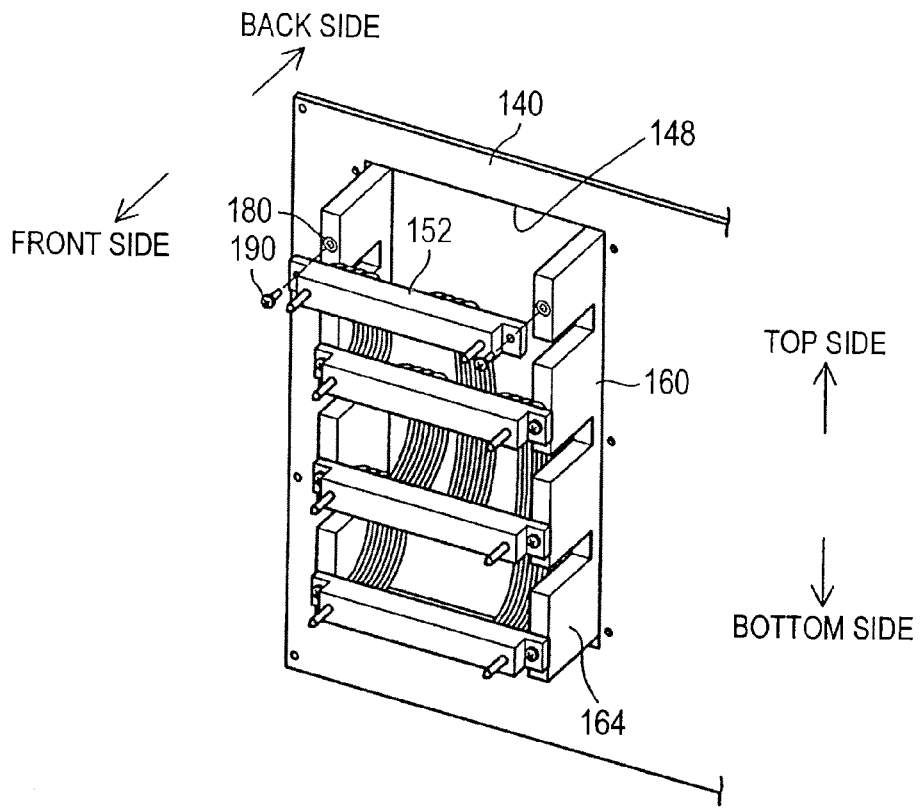
FIG. 2A is a front side perspective view of an adopter that is fixed to a circuit board for interconnect.
Figure 2B:
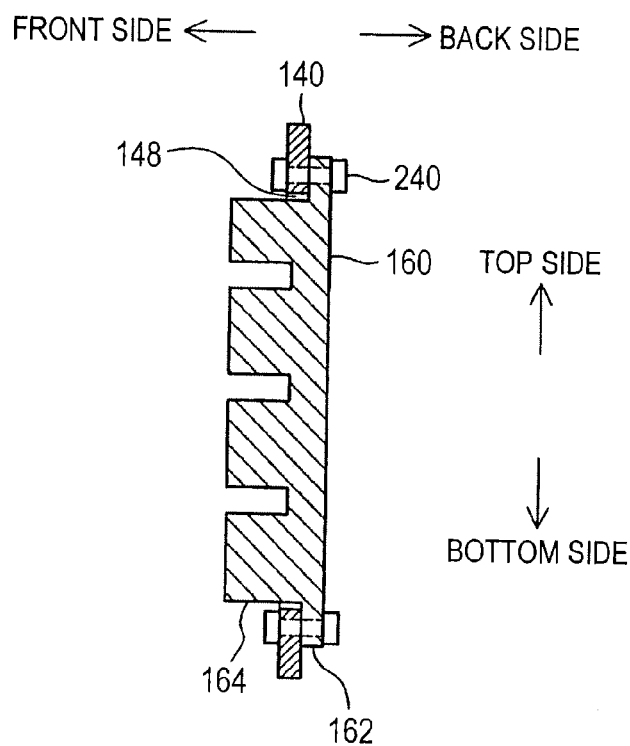
FIG. 2B is a right side cross-sectional view of the circuit board for interconnect and the adopter.

FIGS. 2A and 2B are schematic views showing the configuration of the adopter 160. FIG. 2A is a front side perspective view of the adopter 160 fixed to the circuit board for interconnect 140. FIG. 2B is a cross-sectional view of the circuit board for interconnect 140 and the adopter 160.

In FIG. 2B, the adopter 160 includes a plate-like base 162, and two plate-like projections 164 that are substantially perpendicular to the base 162 and are arranged parallel to each other. In FIG. 2A, the base 162 has a rectangular shape slightly larger than a hole 148 having a rectangular shape formed in the circuit board for interconnect 140. There are provided four cable side connectors 152 corresponding to the four circuit board units 120 in the front end portion of the projections 164 of the adopter 160.

Figure 3:
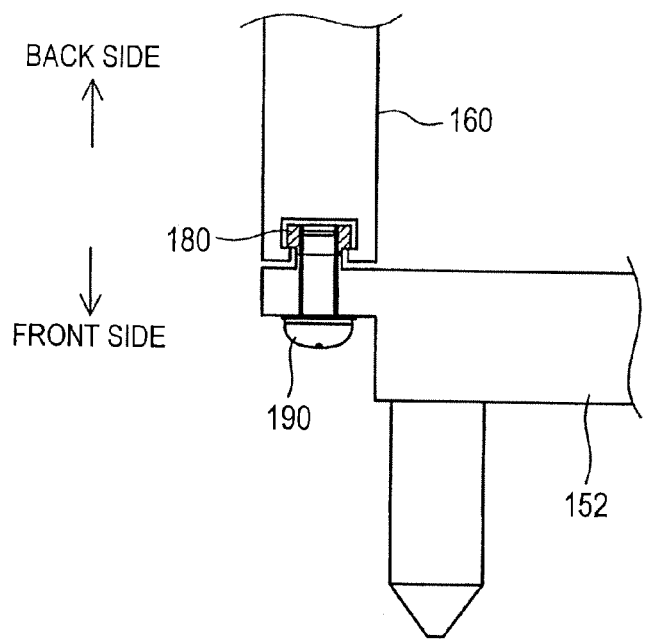
FIG. 3 is an enlarged view of the coupling portion between the cable side connector and the adopter.

FIG. 3 is an enlarged schematic view of the coupling portion between the cable side connector 152 and the adopter 160. In this embodiment, the coupling portion between the cable side connector 152 and the adopter 160 has a floating structure. In other words, in FIG. 3, a floating fastener 180 is pressed into the front end surface of the projection 164 of the adopter 160. The cable side connector 152 is fixed to the adopter 160 by a screw 190 through the floating fastener 180. Thus, the cable side connector 152 has a space in the coupling portion with the adopter 160, to move vertically and horizontally as well as forward and backward by a predetermined distance.

Returning to FIG. 2A, the cable side connectors 152 are electrically or optically coupled through the cable 150. In this embodiment, each of the second and third cable side connecters 152 from the top is coupled one-to-one to the other three cable side connectors 152 through the cable 150. At the same time, each of the top and bottom cable side connectors 152 is coupled one-to-one to the second and third cable side connectors 152 through the cable 150.

The cable 150 used herein may be an electrical coupling cable or an optical coupling cable. Also, both of the two cables may be used together. A high speed coaxial cable is generally used as the electrical coupling cable, which is faster in transfer rate than when the circuit board for interconnect 140 is used and has a small transmission loss. An optical fiber cable is generally used as the optical coupling cable. The data transfer using the optical fiber cable is fast with a small transmission loss, in which no electromagnetic coupling is established between optical fiber cables. For this reason, the interference between optical fiber cables is less than that between electrical coupling coaxial cables. In other words, when the optical fiber cable is used, the number of signals per unit area can be increased compared to the case of using the high speed coaxial cable. As a result, high speed and high packaging density can be achieved in a small space.

By taking advantage of these features, this embodiment uses the cable for electrically or optically coupling the circuit board units 120, or both of the two cables, in order to increase the data transfer rate. In this embodiment, the cable 150 can be construed as both an electrical coupling cable and an optical coupling cable.

The adopter 160, the cable side connectors 152, and the cable 150 are assembled to form a sub module. In other words, in the production of the switch 100, the cable 150 and the cable side connectors 152 are coupled to each other. Further, the cable side connectors 152 are coupled to the adopter 160 to form a sub module. Then, the adopter 160 is fixed to the circuit board for interconnect 140 by screws 240, in a state in which the base 162 of the adopter 160 contacts the back surface of the circuit board for interconnect 140 with the projections 164 projecting forward from the hole 148. In this way, the sub module is integrated into the circuit board for interconnect 140.

It is to be noted that the adopter 160 has a shape and dimensions to ensure the wiring space of the cable 150, with no influence on the power unit 130 while maintaining the reliability of the cable 150.

The cable side connector 152 is located so as to fit into the board unit side connector 124 of the circuit board unit 120 when the circuit board unit 120 is placed in the switch 100. One board unit side connector 124 and one cable side connector 152 are configured such that one is a socket and the other is a header. The two connectors fit together to form a connector pair (second connector pair), and are electrically coupled to each other.

When the cable side connector 152 and the board unit side connector 124 fit together, the circuit board units 120 are electrically or optically coupled to each other through the board unit side connector 124, the cable side connector 152, and the cable 150. In this state, signals can be transmitted and received between the circuit board units 120.

It should be noted that, as described above, each of the second and third cable side connectors 152 from the top is coupled one-to-one to the other three cable side connectors 152 through the cable 150. Then, each of the top and bottom cable side connectors 152 is coupled one-to-one to the second and third cable side connectors 152 through the cable 150. In other words, each of the second and third circuit board units 120 (control units) is electrically or optically coupled to the other three circuit board units 120. Then, each of the top and bottom circuit board units 120 (interface units) is electrically or optically coupled to the two control units.

Here, when the circuit board unit 120 is placed in the switch 100, the fitting between the cable side connector 152 and the board unit side connector 124 (the fitting of the second connector pair) is performed. At the same time, as described above, the fitting between the interconnect board side connector 142 and the board unit side connector 122 (the fitting of the first connector pair) is also performed. In order to achieve both of the two fittings efficiently, the header and the socket should be located in positions where they can fit together in the two connector pairs simultaneously. However, the cable side connector 152 is integrated into the circuit board for interconnect 140 through the adopter 160. Thus, it is not easy to accurately set the cable side connecter 152 and the interconnect board side connector 142 to predetermined positions, or to prevent displacement of the positions of the two connectors. For this reason, it is not easy to set the header and the socket to the positions where they can fit together in the two connector pairs simultaneously. In this embodiment, the coupling portion between the cable side connector 152 and the adopter 160 has a floating structure. For this reason, the header and the socket can be located in the positions where they can fit together in the two connector pairs simultaneously, regardless of the accuracy in the positional relationship between the cable side connector 152 and the interconnect board side connector 142. Thus, both of the fittings can be efficiently achieved in the two connector pairs.

As described above, in the switch 100 according to this embodiment, the electrical coupling between the circuit board units 120 is realized through the circuit board for interconnect 140. At the same time, the electrical or optical coupling between the circuit board units 120 is realized through the cable 150. Thus, signals can be transmitted and received between the circuit board units 120 in the switch 100, by using both of the path through the circuit board for interconnect 140 and the path through the cable 150. In general, the signal transmission and reception is faster through the cable 150 than through the circuit board for interconnect 140. For this reason, the switch 100 of this embodiment can increase the data transfer rate between the circuit board units 120. With respect to the signal transmission between the circuit board units 120 in the switch 100, a high-speed signal (more specifically data to be transferred from the switch 100) is transmitted using the path through the cable 150 and not through the circuit board for interconnect 140. On the other hand, a low-speed signal (more specifically a control signal for controlling the data transfer) is transmitted using the path through the circuit board for interconnect 140. As a result, high-speed data transfer can be achieved in the switch 100.

Further, in the switch 100 of this embodiment, not only the board unit side connector 122 but also the board side connector 124 is provided on the edge of the back side of the circuit board unit 120 (on the side of the circuit board for interconnect 140). Thus, the switch 100 can prevent the mounting area of the external interface connector 126 or semiconductor device from being restricted and the packaging density from being reduced, by the presence of the board unit side connector 124 that forms the signal transmission path through the cable 150. Also, the switch 100 can prevent the maintainability of the circuit board unit 120 from being reduced by the board unit side connector 124 or the cable 150. In addition, the switch 100 can reduce the volume of the cable 150 used in the switch 100 to the minimum.

Further, in the switch 100 of this embodiment, the cable 150, the cable side connectors 152, and the adopter 160 can be assembled to form a sub module. In the production of the switch 100, the assembled sub module is integrated into the circuit board for interconnect 140. Thus, in the switch 100 of this embodiment, it is possible to improve the efficiency of wiring the cable, improve the efficiency of installing the sub module to the electronic device, prevent the occurrence of defects such as disconnections of the cable 150, and increase the packaging density. In addition, it is also possible to improve the efficiency of replacing the cable 150.

Further, in the switch 100 of this embodiment, the notch 170 is formed on the edge of the back side of the circuit board unit 120. The board unit side connector 124 is provided in a portion of the notch 170 formed in the circuit board unit 120. Thus, the position of the board unit side connector 124 in the circuit board unit 120 is more forward (or more distant from the circuit board for interconnect 140) than the position of the board unit side connector 122. In this way, it is possible to ensure the wiring space of the cable 150 while preventing reduction in the packaging density in the switch 100.

B. Second Embodiment

Figure 4:
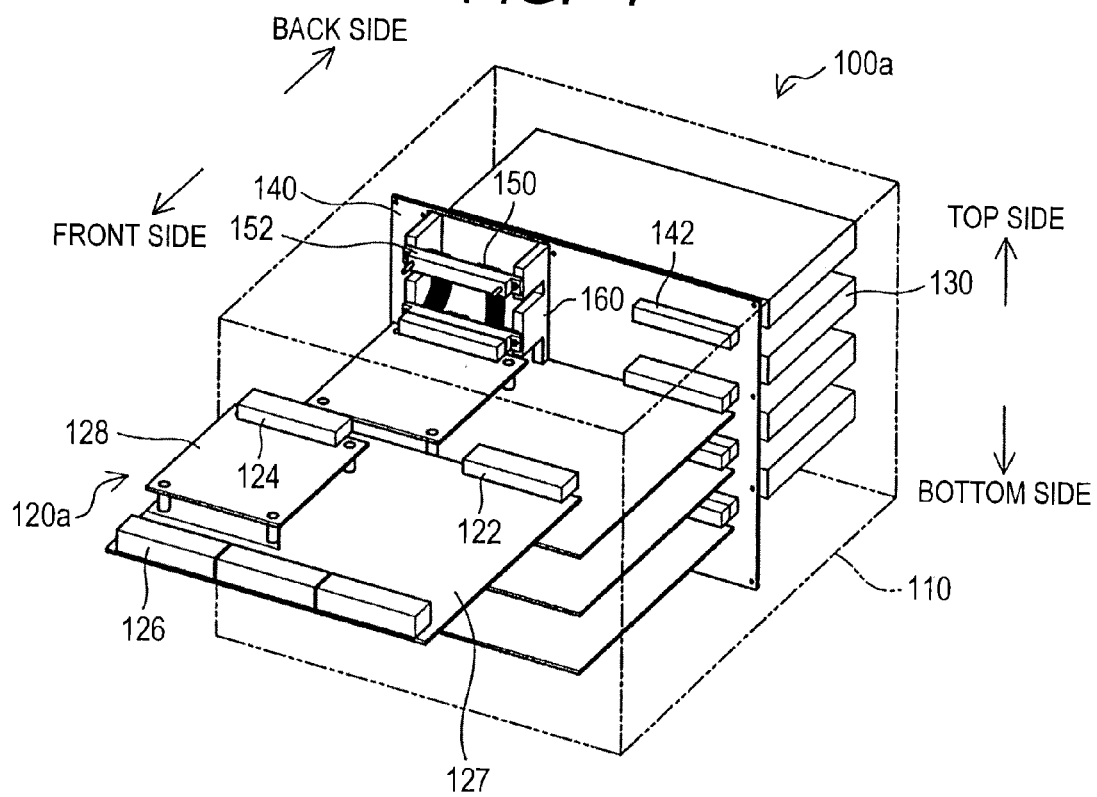
FIG. 4 is a front side perspective view of the switch (part 2)

FIG. 4 is a schematic view showing the configuration of a switch 100*a* as an electronic device according to a second embodiment. The switch 100*a* of the second embodiment is different from the first embodiment shown in FIG. 1, in the configuration of a circuit board unit 120*a*. Other configurations of the switch 100*a* in the second embodiment are the same as in the first embodiment.

In the second embodiment, as shown in FIG. 4, the circuit board unit 120*a* of the switch 100*a* has a structure (a two-story structure) including a main circuit board 127 and a sub circuit board 128 mounted on the main circuit board 127. The main circuit board 127 and the sub circuit board 128 are both available for mounting a semiconductor device.

Figure 5A:
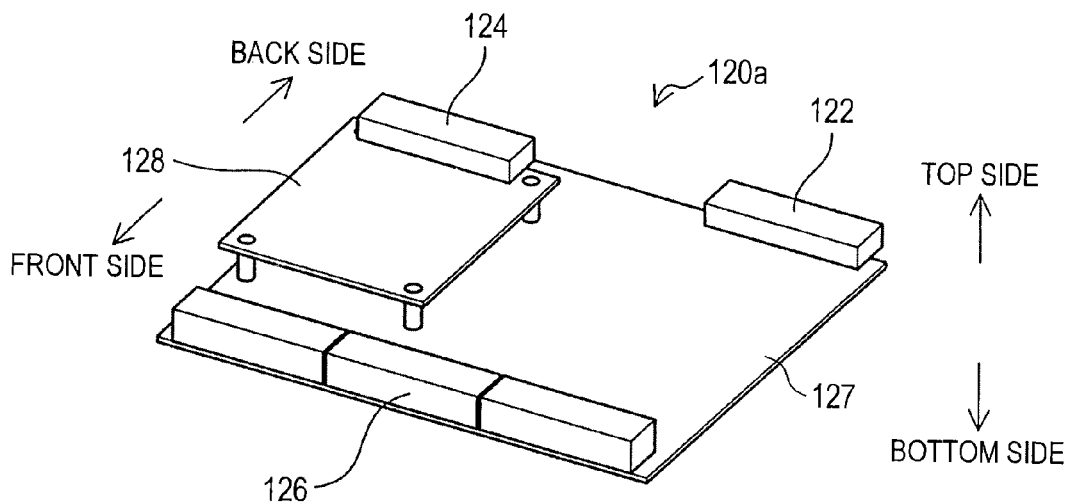
FIG. 5A is a front side perspective view of the circuit board unit.
Figure 5B:
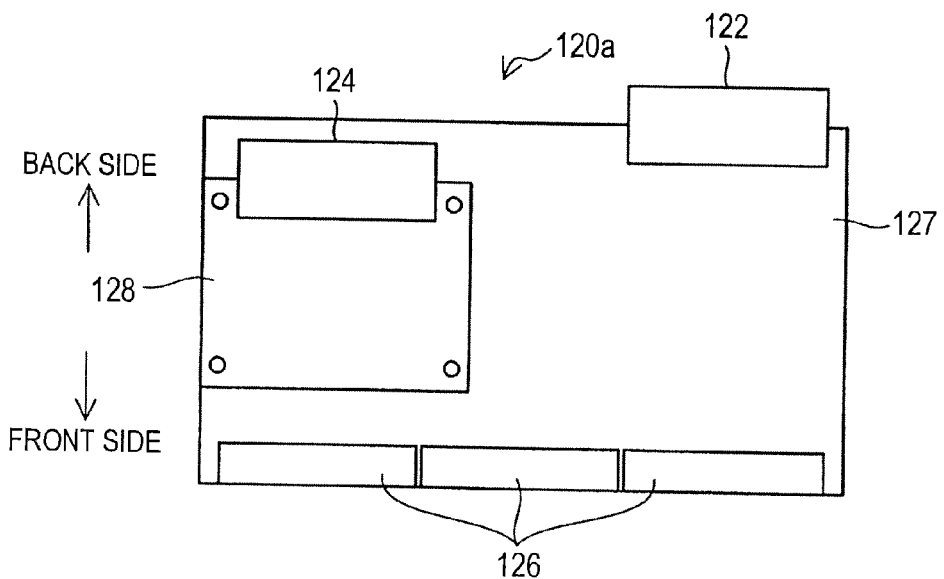
FIG. 5B is a top view of the circuit board unit.

FIGS. 5A and 5B are schematic views showing the configuration of the circuit board unit 120*a* according to the second embodiment. FIG. 5A is a front side perspective view of the circuit board unit 120a. FIG. 5B is a top view of the circuit board unit 120a. As shown in FIGS. 5A and 5B, in the circuit board unit 120a, the board unit side connector 122 is provided on the edge of the back side of the main circuit board 127 (on the side of the circuit board for interconnect 140). The board unit side connector 124 is provided on the edge of the back side of the sub circuit board 128 mounted on the main circuit board 127 (on the side of the circuit board for interconnect 140).

Here, the sub circuit board 128 is mounted on the main circuit board 127 (see FIG. 5B), so that the edge of the back side of the sub circuit board 128 is more forward than the edge of the back side of the main circuit board 127. In this configuration, the position of the board unit side connector 124 provided on the edge of the back side of the sub circuit board 128 is more forward (or more distant from the circuit board for interconnect 140) than the position of the board unit side connector 122 provided on the edge of the back side of the main circuit board unit 127. It is to be noted that, as shown in FIGS. 2A and 2B, slits are formed in the projections 164 of the adopter 160. With this configuration, when the circuit board unit 120a is placed in the switch 100a with the board unit side connector 124 and the cable side connector 152 fitting together, the main circuit board 127 enters the slits and does not interfere with the adopter 160. Further, the cable 150 is provided with a certain allowance in length, so that the main circuit board 127 does not interfere with the cable 150.

As described above, also in the switch 100a of the second embodiment, the position of the board unit side connector 124 is more forward than the position of the board unit side connector 122. Thus, it is possible to ensure the wiring space of the cable 150 while preventing the reduction in the packaging density in the switch 100a. In addition, the presence of the sub circuit board 128 can increase the component area. As a result, the packaging density can also be increased.

C. Modifications

It is to be understood that the present invention is not limited to the above embodiments or examples. The present invention can be applied in various forms without departing from the scope of the claimed invention. More specifically, the following modifications can be considered.

C1. First Modification

Figure 6:
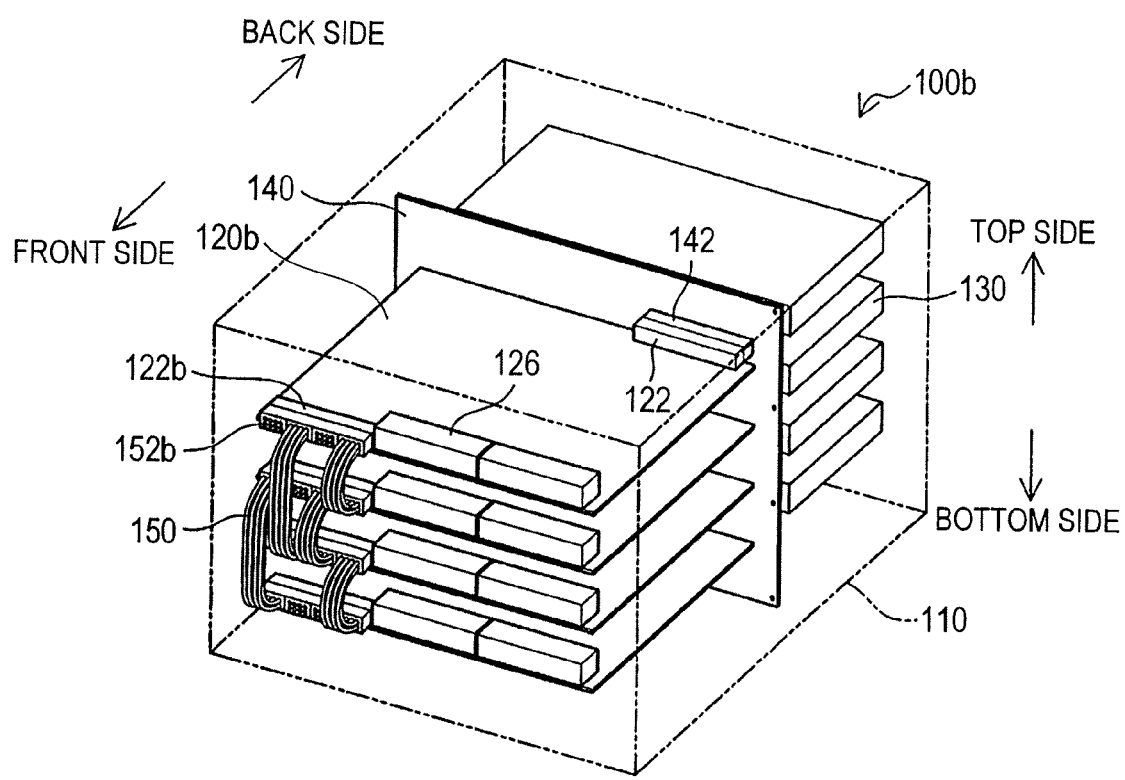
FIG. 6 is a front side perspective view of the switch (part 3)

FIG. 6 is a schematic view showing the configuration of a switch 100b as an electronic device according to a first modification. In FIG. 6, the switch 100b of this modification is different from the first embodiment shown in FIG. 1 in the configuration of a circuit board unit 120b. In other words, in the switch 100b of this modification, a board unit side connector 122b is provided on the edge of the circuit board unit 120b on the front side but not the back side, to form a data transmission path through the cable 150. The circuit board units 120b are coupled to each other, through the board unit side connector 122b, through a cable side connector 152b, and through the cable 150.

Also in the switch 100b of this modification shown in FIG. 6, signals can be transmitted and received between the circuit board units 120b, by using both of the path through the circuit board for interconnect 140 and the path through the cable 150. This makes it possible to increase the data transfer rate between the circuit board units 120b. However, in the switch 100b of this modification, the mounting space of the external interface connector 126 is restricted by the board unit side connector 122b provided on the edge of the front side of the circuit board unit 120b. At the same time, the cable 150 provided on the front side of the circuit board unit 120b may cause a problem with maintaining the switch 100b. For this reason, it is desirable to provide the board unit side connector 122 on the edge of the back side of the circuit board unit 120 as described in the above embodiments.

C2. Second Modification

Figure 7A:
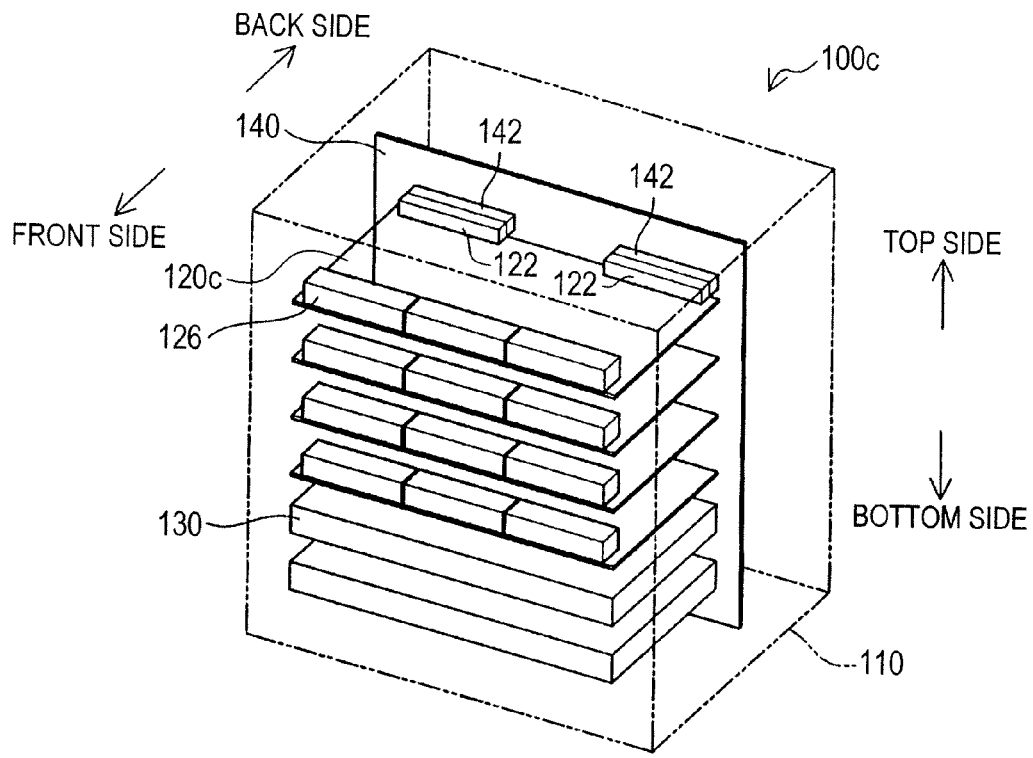
FIG. 7A is a front side perspective view of the switch (part 4)
Figure 7B:
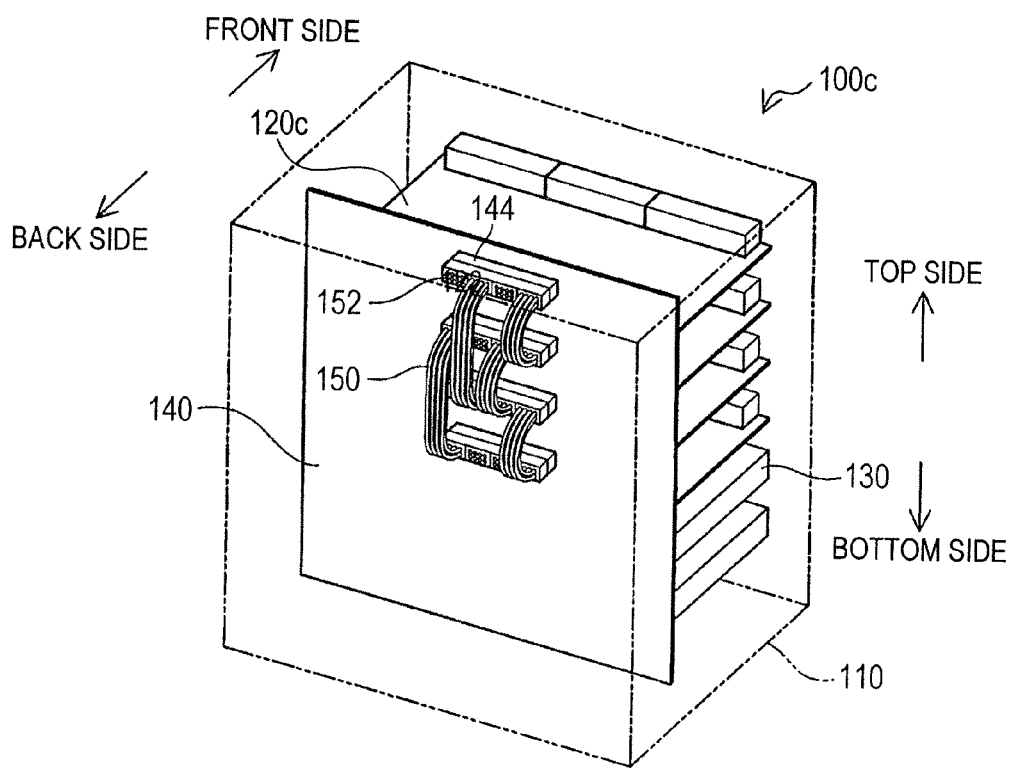
FIG. 7B is a back side perspective view of the switch (part 2).

FIGS. 7A and 7B are schematic views showing the configuration of a switch 100c as an electronic device according to a second modification. FIG. 7A is a perspective view of the front side of the switch 100c. FIG. 7B is a perspective view of the back side of the switch 100c. In the switch 100c of this modification shown in FIGS. 7A and 7B, the coupling between the circuit board units 120c through the cable 150 is achieved through the circuit board for interconnect 140. The second modification is different in this point from the first embodiment of FIG. 1 in which the coupling between the circuit board units 120c through the cable 150 is realized directly and not through the circuit board for interconnect 140. In other words, in the switch 100c of this modification, a back side connector 144, which is provided on the back side of the circuit board for interconnect 140, and the cable side connector 152 form a connector pair. Thus, each of the cable side connectors 152 is coupled through the cable 150. In this way, the cable 150 couples between points of the circuit board for interconnect 140 on the back side of the circuit board for interconnect 140.

Also in the switch 100c of this modification shown in FIGS. 7A and 7B, signals can be transmitted and received between the circuit board units 120c, using the path through the cable 150 as described in the above embodiments. The switch 100c can increase the data transfer rate between the circuit board units 120c. However, in the switch 100c of this modification, the signal transmission and reception between the circuit board units 120c through the cable 150 is realized through both of the circuit board for interconnect 140 and the back side connector 144. For this reason, the increase in the data transfer rate is smaller than that of the switch in the embodiments described above. In addition, the switch 100c requires a wiring space corresponding to the bending radius of the cable 150 on the back side of the circuit board for interconnect 140. This makes it difficult to substantially increase the packaging density of the switch 100c. Thus, as described in the above embodiments, it is desirable to realized the coupling between the circuit board units 120c through the cable 150 directly and not through the circuit board for interconnect 140.

C3. Third Modification

The above embodiments have been described with respect to the switch as the electronic device. However, the present modification can be applied to a network communication device such as a router other than the switch 100, or to an electronic device other than the network communication device. In this case also, with respect to the signal transmission between the circuit board units 120 in the electronic device, a high-speed signal is transmitted using the path through the cable 150 and not through the circuit board for interconnect 140. On the other hand, a low-speed signal is transmitted using the path through the circuit board for interconnect 140. As a result, high-speed data transfer can be realized in the electronic device.

C4. Fourth Modification

In each of the embodiments described above, both of the board unit side connectors 122 and 124 are provided on the edge of the back side of the circuit board unit 120. However, the present invention is not necessarily limited to this arrangement. Further, in each of the embodiments describe above, it is assumed that the cable 150, the cable side connectors 152, and the adopter 160 can be assembled into a sub module.

However, the present invention is not necessarily limited to this configuration. When the cable 150, the cable side connectors 152, and the adopter 60 can be assembled into a sub module, the sub module may not be fixed to the circuit board for interconnect 140, and it may be fixed to the other component such as the chassis 110. Further, in each of the embodiments described above, the cable side connector 152 has a floating structure. However, instead of the cable side connector 152, it is possible to apply the floating structure to the board unit side connector 124 forming the second connector pair with the cable side connector 152. Or it is also possible to apply the floating structure to the interconnect board side connector 142 or board unit side connector 122 of the first pair.

Further, in each of the embodiments described above, the four cable side connectors 152 are all attached to the one adopter 160. However, the four cable side connectors 152 may be attached to different adopters separately. It is also possible that the cable side connector 152 and the adopter 160 are integrally formed into one piece.

Further, in each of the embodiments described above, the circuit board unit 120 is provided on the front side of the circuit board for interconnect 140, and the power unit 130 is provided on the back side of the circuit board for interconnect 140. However, the location of each unit can be arbitrarily changed. More specifically, the circuit board unit 120 and the power unit 130 may be provided on the front side of the circuit board for interconnect 140, or may be provided on the back side thereof. Further, in each of the embodiments described above, the circuit board units 120 are arranged in parallel. However, the circuit board units 120 can also be arranged vertically.

C5. Fifth Modification

In each of the embodiments described above, the circuit board units 120 include both of the board unit side connectors 122 and 124. With this configuration, the coupling between the circuit board units 120 is realized through both of the circuit board for interconnect 140 and the cable 150. However, the present invention is not necessarily limited to the above configuration. In other words, the circuit board units 120 include only the board unit side connector 124 to realize the coupling between the circuit board units 120 only through the cable 150. More specifically, with respect to the signal transmission between the circuit board units 120 in the switch 100, a high-speed signal (data to be transferred from the switch 100) is transmitted using the path through the cable for optical coupling. On the other hand, a low-speed signal (a control signal for controlling the data transfer) is transmitted using the path through the cable for electrical coupling. This configuration can eliminate the coupling through the circuit board for interconnect 140 in the coupling between the circuit board units 120. As a result, high-speed data transfer can be realized in the switch 100.

What is claimed is:

1. A communication apparatus comprising:
   a plurality of first circuit board units that are removable from the communication apparatus, each comprising:
      a first board unit side connector;
      a second board unit side connector,
      wherein the first and second board unit side connectors are provided in a same edge of the first circuit board unit; and
      an external interface connector to be connected to a network, which is provided in a second edge of the first circuit board unit opposite from the same edge;
   a circuit board for interconnect comprising an interconnect board side connector which is electrically fitted to the first board unit side connector of at least one of the plurality of first circuit board units; and
   a cable comprising plurality of cable side connectors each of which is fitted to the second board unit side connector of at least two of the plurality of first circuit board units, and
   wherein the first board unit side connector of the each first circuit board unit is coupled to other first circuit board units of the plurality of first circuit board units via the circuit board for interconnect, and the second board unit side connector of the each first circuit board unit is coupled to other first circuit board units of the plurality of first circuit board units via the cable.

2. The communication apparatus according to claim 1, wherein the cable includes an optical fiber to couple the plurality of first circuit board units.

3. The communication apparatus according to claim 1, wherein the cable comprises:
   a coaxial cable to couple the plurality of first circuit board units; and
   an optical fiber to couple the plurality of first circuit board units.

4. The communication apparatus according to claim 1, further comprising:
   an adopter for forming a sub module with the cable and the cable side connector.

5. The communication apparatus according to claim 4, wherein the adopter is fixed to the circuit board for interconnect.

6. The communication apparatus according to claim 5, wherein at least one of the cable side connector and the second board unit side connector has a floating structure configured to allow the particular connector to move in a predetermined direction by a predetermined distance.

7. The communication apparatus according to claim 1, wherein a position of the second board unit side connector in the first circuit board unit is more distant from the circuit board for interconnect than a position of the first board unit side connector.

8. The communication apparatus according to claim 7,
   wherein a notch is formed on an edge of the first circuit board unit on a side of the circuit board for interconnect,
   wherein the second board unit side connector is provided in a portion of the notch formed in the first circuit board unit.

9. The communication apparatus according to claim 7,
   wherein the first circuit board unit comprises a main circuit board and a sub circuit board mounted on the main circuit board,
   wherein an edge of the sub circuit board on the circuit board for interconnect is more distant from the circuit board for interconnect than the main circuit board,
   wherein the first board unit side connector is provided on an edge of the main circuit board on the side of the circuit board for interconnect,
   wherein the second board unit side connector is provided on the edge of the sub circuit board on the side of the circuit board for interconnect.

10. The communication apparatus according to claim 1,
   wherein the communication apparatus is a network communication device for transfer of data in a network,
   wherein at least one of the plurality of first circuit board units has an interface function for the data transfer,
   wherein at least one of the plurality of first circuit board units has a control function for controlling the data transfer.

11. The communication apparatus according to claim 10, wherein transmission of the data between the plurality of first circuit board units is performed through the cable, wherein transmission of signals for the control between the plurality of first circuit board units is performed through the circuit board for interconnect.

12. The communication apparatus according to claim 1,
a first connector pair comprising the first board unit side connector and the interconnect board side connector configured such that one is a socket and the other is a header, and
a second connector pair comprising the second board unit side connector and the cable side connector configured such that one is a socket and the other is a header.

* * * * *